(12) United States Patent
Dou et al.

(10) Patent No.: US 10,014,296 B1
(45) Date of Patent: Jul. 3, 2018

(54) FIN-TYPE FIELD EFFECT TRANSISTORS WITH SINGLE-DIFFUSION BREAKS AND METHOD

(71) Applicant: GLOBALFOUNDRIES INC., Grand Cayman (KY)

(72) Inventors: Xinyuan Dou, Clifton Park, NY (US); Hong Yu, Rexford, NY (US); Sipeng Gu, Clifton Park, NY (US); Yanzhen Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/487,636

(22) Filed: Apr. 14, 2017

(51) Int. Cl.
*H01L 21/761* (2006.01)
*H01L 29/165* (2006.01)
*H01L 27/088* (2006.01)
*H01L 21/8234* (2006.01)
*H01L 21/02* (2006.01)
(Continued)

(52) U.S. Cl.
CPC .... *H01L 27/0886* (2013.01); *H01L 21/02532* (2013.01); *H01L 21/761* (2013.01); *H01L 21/76224* (2013.01); *H01L 21/823418* (2013.01); *H01L 21/823431* (2013.01); *H01L 21/823468* (2013.01); *H01L 21/823475* (2013.01); *H01L 21/823481* (2013.01); *H01L 29/0646* (2013.01); *H01L 29/0649* (2013.01); *H01L 29/0847* (2013.01); *H01L 29/165* (2013.01); *H01L 29/66545* (2013.01);
(Continued)

(58) Field of Classification Search
CPC ............... H01L 27/0886; H01L 21/761; H01L 21/02532; H01L 21/76224; H01L 21/823418; H01L 21/823431; H01L 21/823468; H01L 21/823475; H01L 21/823481; H01L 29/0646; H01L 29/0649; H01L 29/0847; H01L 29/165; H01L 29/66545; H01L 29/66636; H01L 29/7848; H01L 29/7851
See application file for complete search history.

(56) References Cited

U.S. PATENT DOCUMENTS 8,846,491 B1    9/2014    Pham et al.
8,916,460 B1    12/2014    Kwon et al.
(Continued)

*Primary Examiner* — Fazli Erdem
(74) *Attorney, Agent, or Firm* — Gibb & Riley, LLC; Francois Pagette

(57) ABSTRACT

Disclosed is a method of forming a semiconductor structure that includes one or more fin-type field effect transistors (FINFETs) and single-diffusion break (SDB) type isolation regions that are within a semiconductor fin and that define the active device region(s) for the FINFET(s). The isolation regions are formed so that they include a semiconductor liner. The semiconductor liner ensures that, when a source/drain recess is formed immediately adjacent to the isolation region, the bottom and opposing sides of the source/drain recess will have semiconductor surfaces onto which epitaxial semiconductor material for a source/drain region is grown. As a result, the angle of the top surface of the source/drain region relative to the top surface of the semiconductor fin is minimized. Thus, the risk that a subsequently formed source/drain contact will not reach the source/drain region is also minimized. Also disclosed is a semiconductor structure formed according to the method.

20 Claims, 22 Drawing Sheets

(51) Int. Cl.
  *H01L 29/06* (2006.01)
  *H01L 29/78* (2006.01)
  *H01L 29/66* (2006.01)
  *H01L 29/08* (2006.01)
  *H01L 21/762* (2006.01)

(52) U.S. Cl.
  CPC .... *H01L 29/66636* (2013.01); *H01L 29/7848* (2013.01); *H01L 29/7851* (2013.01)

(56) References Cited

U.S. PATENT DOCUMENTS

| | | | |
|---|---|---|---|
| 9,123,773 B1* | 9/2015 | Shen | H01L 21/76232 |
| 9,171,752 B1 | 10/2015 | Wu et al. | |
| 9,368,496 B1* | 6/2016 | Yu | H01L 27/0886 |
| 9,412,616 B1 | 8/2016 | Xie et al. | |
| 9,524,911 B1* | 12/2016 | Tsai | H01L 29/401 |
| 9,548,356 B2* | 1/2017 | Doris | H01L 21/76224 |
| 2015/0187944 A1* | 7/2015 | Ching | H01L 29/785 |
| | | | 257/190 |
| 2016/0049468 A1 | 2/2016 | Wu et al. | |
| 2016/0225762 A1 | 8/2016 | Zang et al. | |
| 2017/0278925 A1* | 9/2017 | Peng | H01L 29/0649 |

\* cited by examiner

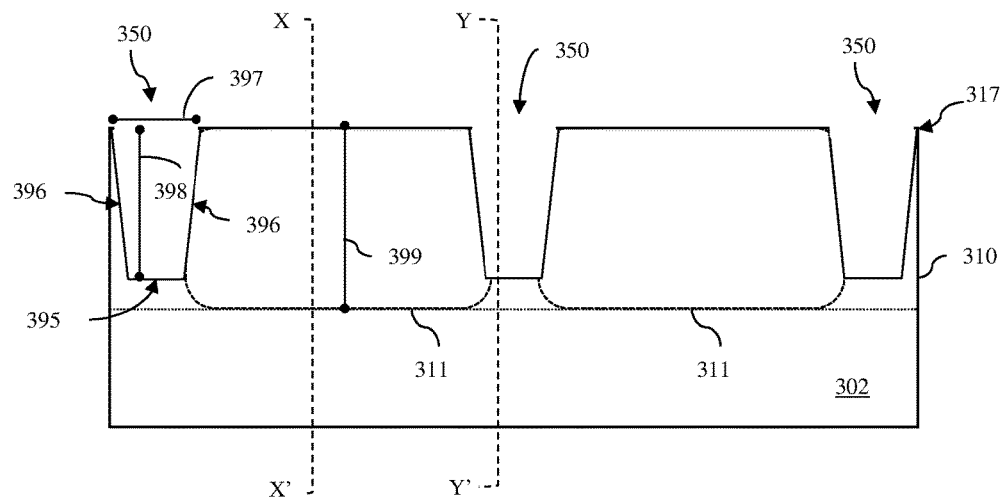
FIG. 4A
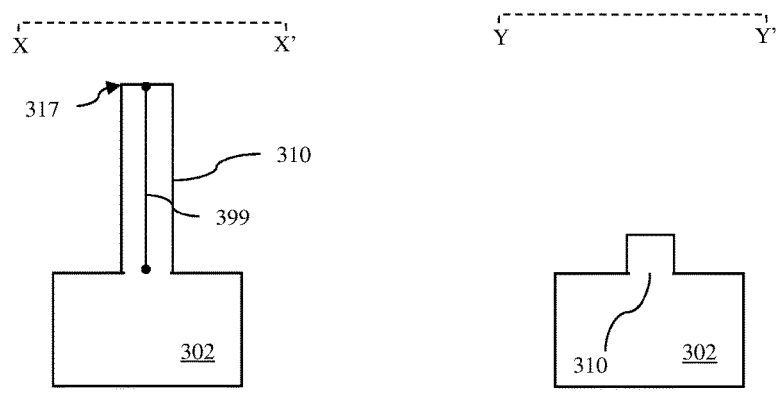
FIG. 4B
FIG. 4C

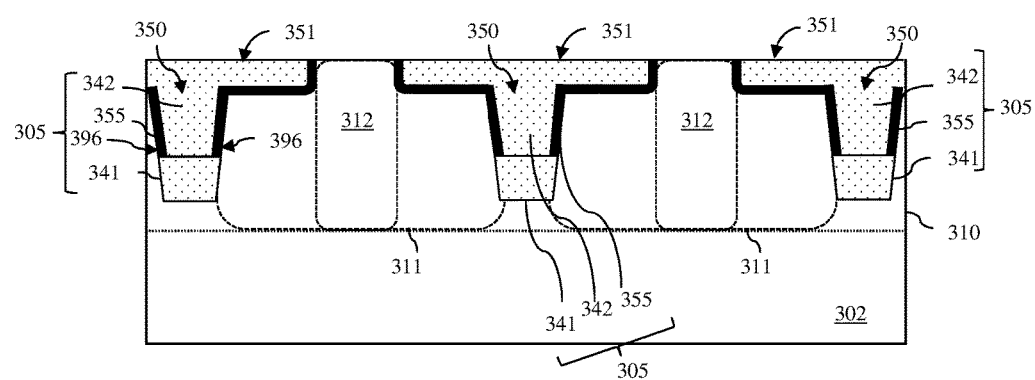
FIG. 12A
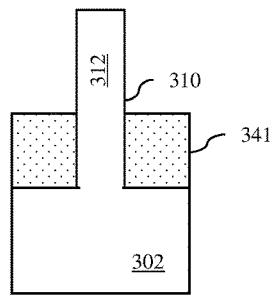 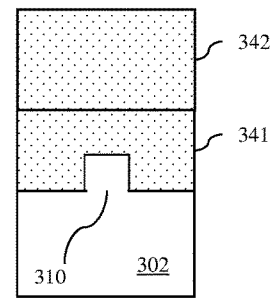
FIG. 12B  FIG.12C

FIN-TYPE FIELD EFFECT TRANSISTORS WITH SINGLE-DIFFUSION BREAKS AND METHOD

BACKGROUND

Field of the Invention

The present invention relates to single-diffusion break (SDB) fin-type field effect transistors (FINFETs) and an improved method of forming such SDB FINFETs.

Description of Related Art

More specifically, integrated circuit design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects and a decrease in drive current. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits increased drive current. Unfortunately, as FINFET size continues to decrease and FINFET density continues to increase, it can be difficult to form FINFETs without compromising robustness.

SUMMARY

In view of the foregoing, disclosed herein is a method of forming a semiconductor structure that includes one or more fin-type field effect transistors (FINFETs) and single-diffusion break (SDB) type isolation regions, which define the active device region(s) for the FINFET(s). Specifically, in the method, the isolation regions can be formed within a semiconductor fin so that they include a semiconductor liner. The semiconductor liner ensures that, when a source/drain recess is formed immediately adjacent to an isolation region, the bottom and opposing sides of the source/drain recess will have semiconductor surfaces onto which epitaxial semiconductor material for a source/drain region can be grown. As a result, the angle of the top surface of the source/drain region relative to the top surface of the semiconductor fin will be minimized. Thus, the risk that a subsequently formed source/drain contact will not reach the source/drain region (i.e., the risk of an unlanded source/drain contact) will also be minimized. Also disclosed herein is a semiconductor structure formed according to the method.

More particularly, disclosed herein are embodiments of a method of forming a semiconductor structure that includes one or more fin-type field effect transistors (FINFETs) and single-diffusion break (SDB)-type isolation regions, which define the active device region(s) for the FINFET(s).

Generally, each of the method embodiments includes forming trenches in a semiconductor fin to define at least one active device region within the semiconductor fin. A first isolation layer can be deposited so as to fill the trenches. Subsequently, the first isolation layer can be etched back so that lower portions of the trenches remain filled with the first isolation layer and so that upper portions of the trenches above the lower portions have exposed sidewalls. Semiconductor surfaces of the exposed sidewalls of the upper portions of the trenches can then be lined with a semiconductor layer. Then, a second isolation layer can be deposited onto the first isolation layer so as to fill any remaining space within the upper portions of the trenches, thereby forming trench isolation regions and, particularly, SDB-type isolation regions. After the trench isolation regions are formed, source/drain recesses can be formed within the active device region adjacent to the trench isolation regions and source/drain regions can be formed by epitaxially depositing an additional semiconductor layer in the source/drain recesses.

In one particular method embodiment, first trenches can be formed in a semiconductor fin to define at least one active device region. These first trenches can have a first width and a first depth. A first isolation layer can be deposited so as to fill the first trenches. Then, second trenches can be formed in the semiconductor fin such that they have a second width that is greater than the first width, such that they have a second depth that is less than the first depth, and such that they are essentially centered on the first trenches, thereby ensuring that the first isolation layer is exposed at the bottoms of the second trenches. After the second trenches are formed, the first isolation layer can be etched back so that lower portions of the first trenches remain filled with the first isolation layer and so that upper portions of the first trenches above the lower portions have exposed sidewalls. Semiconductor surfaces of the second trenches and the exposed sidewalls of the upper portions of the first trenches can be lined with a semiconductor layer. Then, a second isolation layer can be deposited onto the first isolation layer so as to fill any remaining space within the second trenches and the upper portions of the first trenches, thereby forming trench isolation regions and, particularly SDB-type isolation regions. After the trench isolation regions are formed, source/drain recesses can be formed within the active device region adjacent to the trench isolation regions and source/drain regions can be formed by epitaxially depositing an additional semiconductor layer in the source/drain recesses.

It should be noted that in each of the method embodiments described above the semiconductor layer within the trench isolation regions (i.e., the semiconductor liner) ensures that, if/when a source/drain recess is formed so that it abuts an adjacent trench isolation region, semiconductor surfaces will be exposed, not only at a first side of the source/drain recess adjacent to the channel region and a bottom of the source/drain recess, but also at a second side of the source/drain recess opposite the first side (i.e., at the trench isolation region). Thus, when the additional semiconductor layer is epitaxially deposited into that source/drain recess, it will grow, not only on the first side and bottom of the source/drain recess, but also on the second side of the source/drain recess. That is, the additional semiconductor layer of the source/drain region will be epitaxially deposited into the source/drain recess such that it is positioned laterally immediately adjacent to the semiconductor layer of the adjacent trench isolation region. As a result, the angle of the top surface of the source/drain region relative to the top surface of the semiconductor fin will be minimized. By ensuring that the top surfaces of the source/drain regions are not significantly angled relative to the top surface of the semiconductor fin, the method minimizes the risk of unlanded source/drain contacts during subsequent processing.

Also disclosed herein are embodiments of a semiconductor structure that includes one or more fin-type field effect transistors (FINFETs) and single-diffusion break (SDB) type isolation regions, which define the active device region(s) for the FINFET(s). Specifically, the semiconductor structure can include a semiconductor fin and one or more active device regions for one or more FINFETs located within the semiconductor fin.

The semiconductor structure can further include trench isolation regions and, particularly, SDB-type isolation regions located within the semiconductor fin such that each active device region is positioned laterally between a pair of trench isolation regions. Each trench isolation region (i.e., each SDB-type isolation region) can include a trench that extends essentially vertically into the semiconductor fin and that has a lower portion and an upper portion above the lower portion. With each trench, a first isolation layer can fill the lower portion. Additionally, within each trench, a semiconductor layer (e.g., an epitaxial semiconductor layer) can line opposing sidewalls in the upper portion and a second isolation layer can fill any remaining space in the upper portion. That is, the second isolation layer can be above and immediately adjacent to a top surface of the first isolation layer and can be positioned laterally immediately adjacent to and between portions of the semiconductor layer.

The semiconductor structure can further include at least one transistor and, particularly, at least one FINFET. The FINFET can include, within an active device region of the semiconductor fin, source/drain regions and a channel region positioned laterally between the source/drain regions. Each source/drain region can include a source/drain recess and an additional semiconductor layer (e.g., an additional epitaxial semiconductor layer) within the source/drain recess. Optionally, a source/drain recess can abut an adjacent trench isolation region such that the additional semiconductor layer of the source/drain region is positioned laterally immediately adjacent to the semiconductor layer of that adjacent trench isolation region.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 4A-4C are cross-section diagrams illustrating a partially completed semiconductor structure formed according to the flow diagram of FIG. 2;

FIGS. 12A-12C are cross-section diagrams illustrating a partially completed semiconductor structure formed according to the flow diagram of FIG. 2;

DETAILED DESCRIPTION

As mentioned above, as fin-type field effect transistor (FINFET) size continues to decrease and FINFET density continues to increase, it can be difficult to form FINFETs without compromising robustness.

Figure 1A:
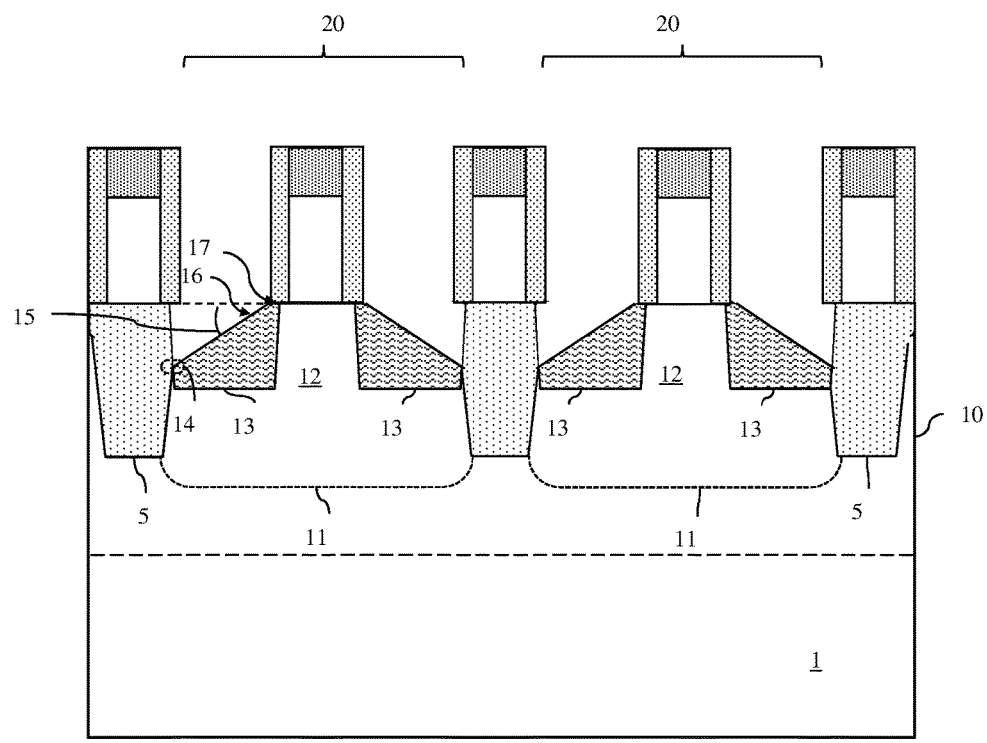
FIGS. 1A-1B are cross-section diagrams illustrating formation of a semiconductor structure with fin-type field effect transistors (FINFETs) with single diffusion break (SDB) type isolation regions.
Figure 1B:
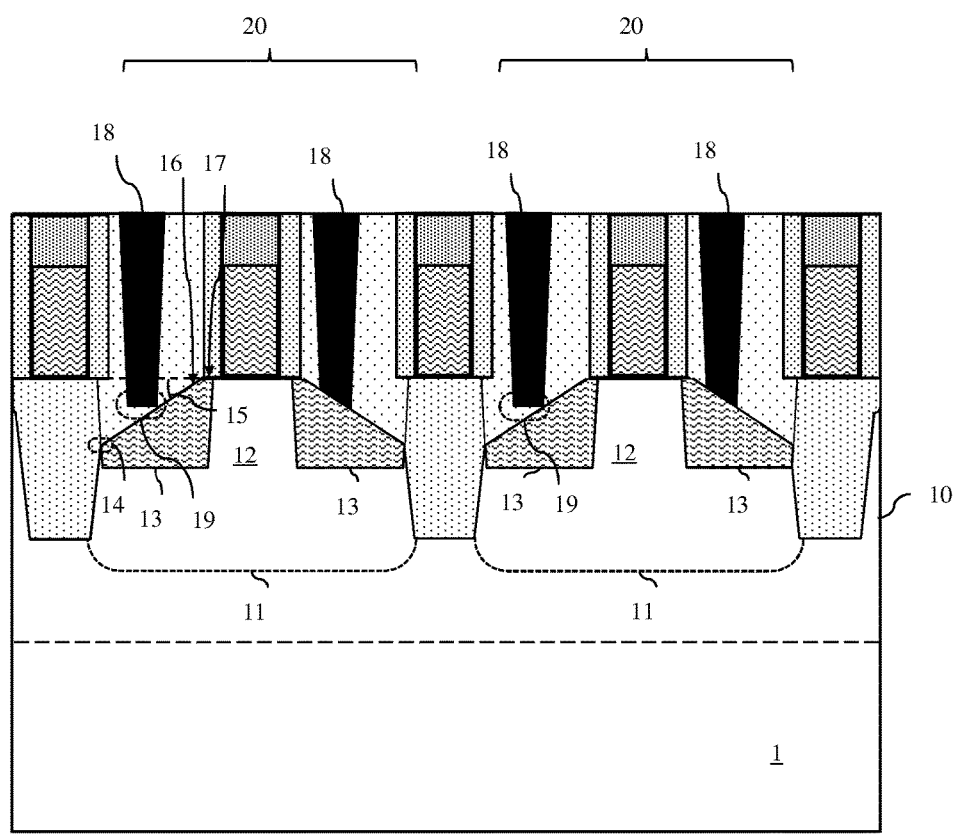

For example, referring to FIGS. 1A-1B, in conventional single-diffusion break (SDB) FINFET processing, a relatively long semiconductor fin 10 is formed on a substrate 1. Thereafter, portions of the semiconductor fin are removed or cut (e.g., using conventional lithographic patterning and etch processes) to create trenches within the semiconductor fin 10. The trenches are then filled with isolation material to form isolation regions 5 (referred to as single-diffusion breaks (SDBs)). The isolation regions 5 define one or more active device region(s) 11 within the semiconductor fin 10. Additional processes are then performed in order to form FINFET(s) 20 using the active device region(s) 11. Oftentimes, these additional processes include forming epitaxial source/drain regions 13. That is, source/drain recesses are formed within each active device region 11 on opposing sides of a channel region 12. Subsequently, epitaxial semiconductor material for the epitaxial source/drain regions 13 is grown within each of the source/drain recesses. However, if a source/drain recess is formed immediately adjacent to an adjacent isolation region 5, the exposed surfaces on which the epitaxial semiconductor material is grown within that source/drain recess will include both isolation surfaces of the adjacent isolation region 5 and semiconductor surfaces of the semiconductor fin 10. In this case, a facet corner 14 of the top surface 16 of the epitaxial source/drain region 13 will be located deep within the recess (e.g., adjacent the bottom of the recess) and, thus, the top surface 16 of the epitaxial source/drain regions 13 will be significantly angled relative to the top surface 17 of the semiconductor fin 10. Unfortunately, when the angle 15 of the top surface 16 of an epitaxial source/drain region 13 is relatively large, landing of subsequently formed source/drain contacts 18 on the top surface 16 of the epitaxial source/drain region 13 can be difficult and can lead to a void 19 and, thereby a defective device (see FIG. 1B).

In view of the foregoing, disclosed herein is a method of forming a semiconductor structure that includes one or more fin-type field effect transistors (FINFETs) and single-diffusion break (SDB) type isolation regions, which are within a semiconductor fin and which define the active device region(s) for the FINFET(s). Specifically, in the method, the isolation regions can be formed within a semiconductor fin so that they include a semiconductor liner. The semiconductor liner ensures that, when a source/drain recess is formed immediately adjacent to an isolation region, the bottom and opposing sides of the source/drain recess will have semiconductor surfaces onto which epitaxial semiconductor material for a source/drain region can be grown. As a result, the angle of the top surface of the source/drain region relative to the top surface of the semiconductor fin will be minimized. Thus, the risk that a subsequently formed source/drain contact will not reach the source/drain region (i.e., the risk of an unlanded source/drain contact) will also be minimized. Also disclosed herein is a semiconductor structure formed according to the method.

Figure 2:
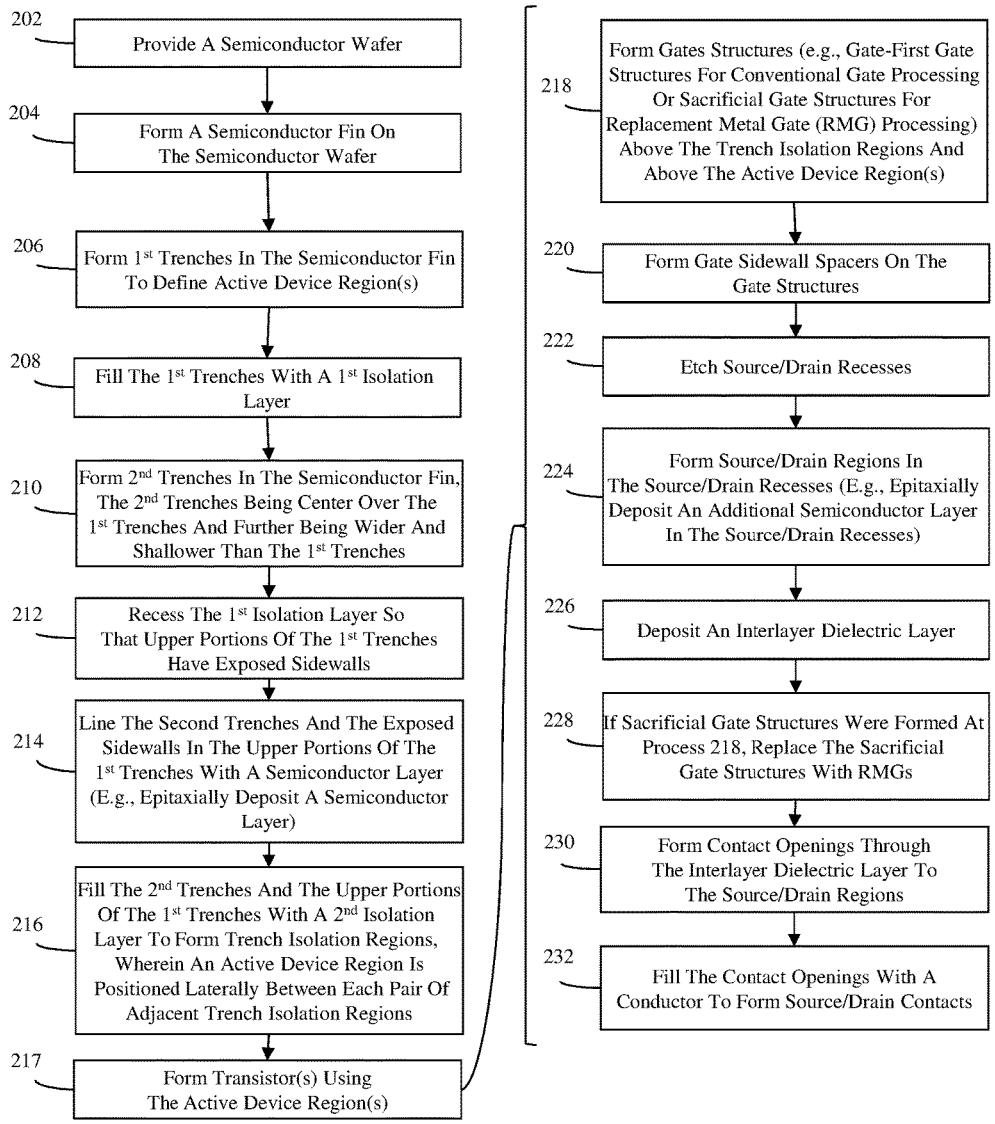
FIG. 2 is a flow diagram illustrating an improved method of forming a semiconductor structure that includes one or more fin-type field effect transistors (FINFETs) and single-diffusion break (SDB) type isolation regions.

More particularly, referring to the flow diagram of FIG. 2, disclosed herein are embodiments of a method of forming a semiconductor structure that includes one or more fin-type field effect transistors (FINFETs) and single-diffusion break (SDB)-type isolation regions, which are within a semiconductor fin and which define the active device region(s) for the FINFET(s).

Figure 3A:
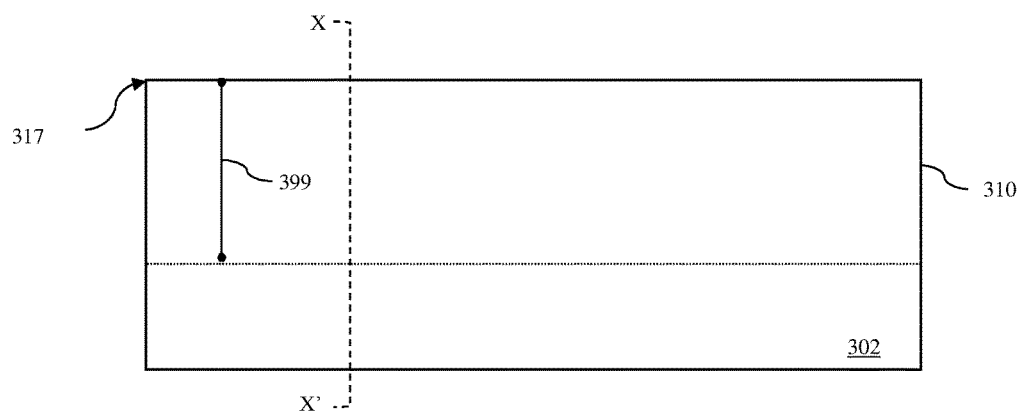
FIGS. 3A-3B are cross-section diagrams illustrating a partially completed semiconductor structure formed according to the flow diagram of FIG. 2.
Figure 3B:
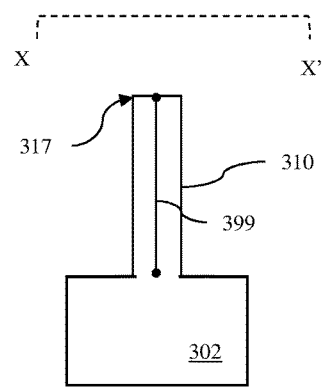

The method can include providing a semiconductor wafer (202, see FIGS. 3A-3B). The semiconductor wafer can be a bulk semiconductor wafer 302, as illustrated. Alternatively, the semiconductor wafer can be, for example, a semiconductor-on-insulator wafer (e.g., a silicon-on-insulator (SOI) wafer or any other suitable semiconductor-on-insulator wafer) (not shown). Such a semiconductor-on-insulator wafer can include a substrate (e.g., a silicon substrate or any other suitable substrate including, but not limited to, a silica glass substrate or a silicon carbide (SiC) substrate), an insulator layer (e.g., a buried oxide (BOX) layer or other suitable insulator layer) on the substrate and a semiconductor layer on the insulator layer. In any case, the bulk semiconductor wafer 302 (or, if applicable, the semiconductor layer of the semiconductor-on-insulator wafer) can be made of a first semiconductor material (e.g., silicon or some other suitable monocrystalline semiconductor material).

The method can further include forming at least one semiconductor fin 310 on the semiconductor wafer (204, see FIGS. 3A-3B). For purposes of this disclosure a semiconductor fin refers to a relatively tall and thin, elongated, semiconductor body that is essentially rectangular in shape. The semiconductor fin 310 can be formed the upper portion of the bulk semiconductor wafer 302 (or from the semiconductor layer of a semiconductor-on-insulator wafer) using, for example, conventional lithographic patterning techniques or sidewall image transfer (SIT) techniques. Thus, the semiconductor fin 310 will be made of the first semiconductor material (e.g., silicon or some other suitable monocrystalline semiconductor material). In any case, the semiconductor fin 310 can have a top surface 317 and a height 399. It should be noted that the semiconductor fin 310 could be doped, either before or after formation, so that channel region(s), which will be located within the semiconductor fin 310, have appropriate type conductivity at a relatively low conductivity level. For example, for a P-type FINFET, the semiconductor fin 310 can have an N− conductivity; whereas, for an N-type FINFET, the semiconductor fin 310 can have a P− conductivity. Alternatively, the semiconductor fin 310 can be undoped.

First trenches 350 can then be formed in the semiconductor fin 310 (206, see FIG. 4A-4C). Specifically, conventional lithographic patterning and selective etch techniques can be performed to form first trenches 350 and, particularly, at least one pair of adjacent first trenches 350 in the semiconductor fin 310. Each pair of adjacent first trenches 350 within the semiconductor fin 310 can be patterned so as to define an active device region 311 for a corresponding fin-type field effect transistor (FINFET). The first trenches 350 can have a first depth 398, as measured from the top surface 317 of the semiconductor fin 310, and a first width 397, as measured at the top surface 317 of the semiconductor fin 310 in a direction perpendicular to the width of the semiconductor fin 310 (see FIG. 4A). Additionally, each first trench 350 can have opposing sidewalls 396 and a bottom 395 within the semiconductor fin 310 such that semiconductor surfaces are exposed at the opposing sidewalls 396 and the bottom 395 (see FIG. 4A). Each first trench 350 can further cut across the full width of the semiconductor fin 310 (see FIG. 4C).

Figure 5A:
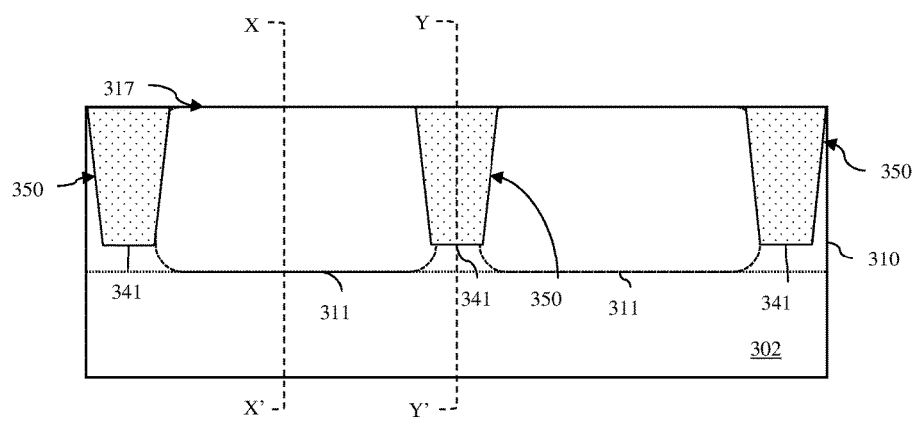
FIGS. 5A-5C are cross-section diagrams illustrating a partially completed semiconductor structure formed according to the flow diagram of FIG. 2.
Figures 5B, 5C:
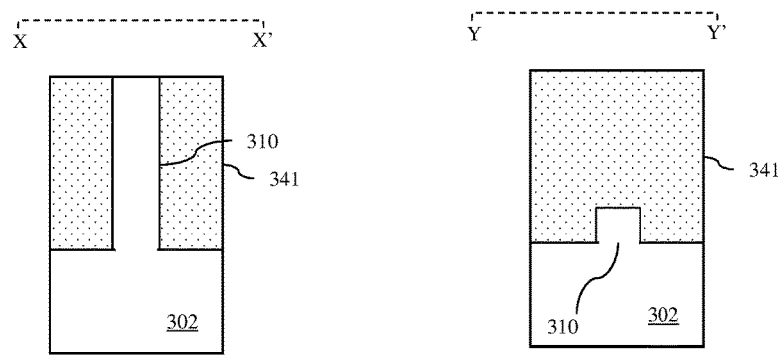

A first isolation layer 341 can be deposited so as to fill the first trenches 350 (208, see FIGS. 5A-5C). The first isolation layer 341 can be, for example, a layer of silicon dioxide that is deposited, for example, by flowable chemical vapor deposition (FCVD). Alternatively, the first isolation layer 341 can be one or more layers of silicon dioxide, silicon nitride, silicon carbon nitride, silicon boron carbon nitride, silicon oxycarbide, or any other suitable isolation material.

It should be noted that at process 208, the first isolation layer 341 can be deposited as a blanket layer such that it not only fills the first trenches 350, but so that it also laterally surrounds the semiconductor fin 310 (i.e., so that it is positioned laterally immediately adjacent to and covers the opposing sides of the semiconductor fin 310, as illustrated). Alternatively, prior to forming the first trenches, a layer of isolation material, which is the same as that used for the first isolation layer 341, can be deposited and a polishing process can be performed to expose the top surface of the semiconductor fin. Then, the first trenches can be formed in the semiconductor fin and filled with the first isolation layer, thereby resulting in essentially the same partially completed structure with the first trenches and the area laterally surrounding the semiconductor fin containing the same isolation material.

Next, a polishing process (e.g., a CMP process) can be performed to expose the top surface 317 of the semiconductor fin 310.

Figure 6A:
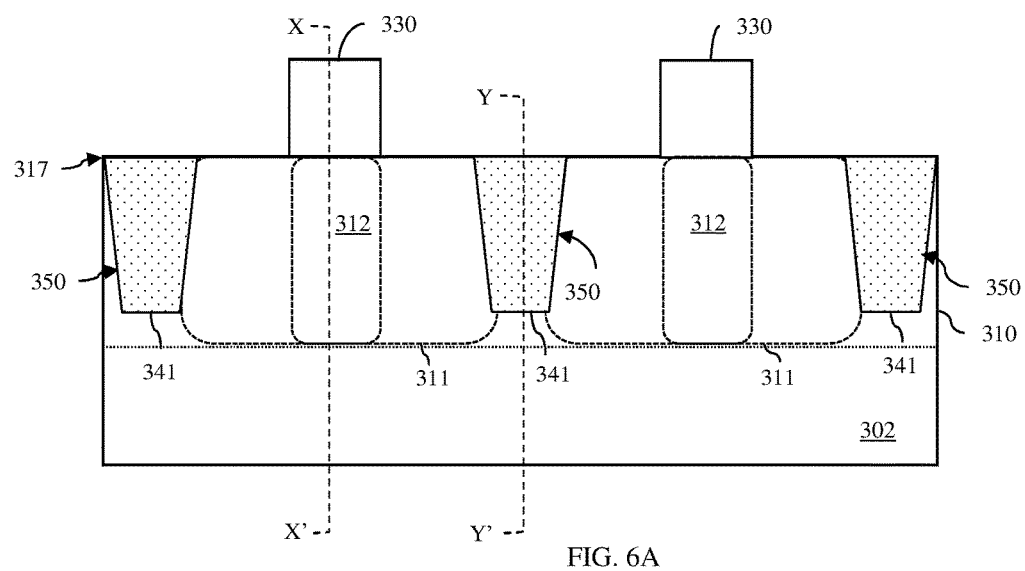
FIGS. 6A-6C are cross-section diagrams illustrating a partially completed semiconductor structure formed according to the flow diagram of FIG. 2.
Figure 6B:
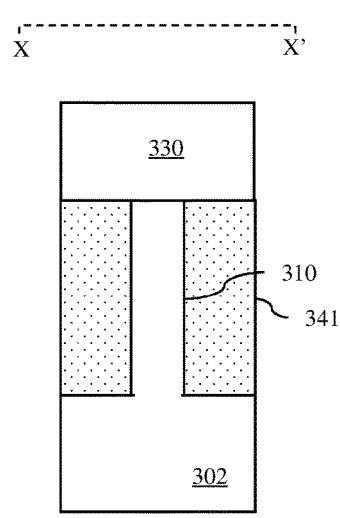
Figure 6C:
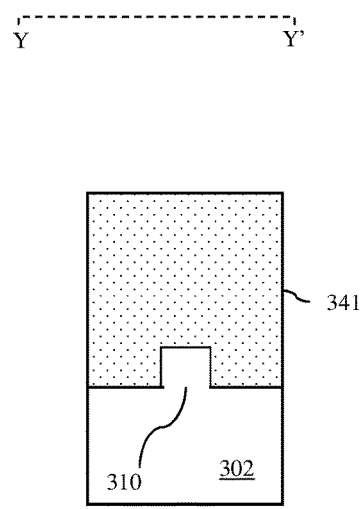
Figure 7:
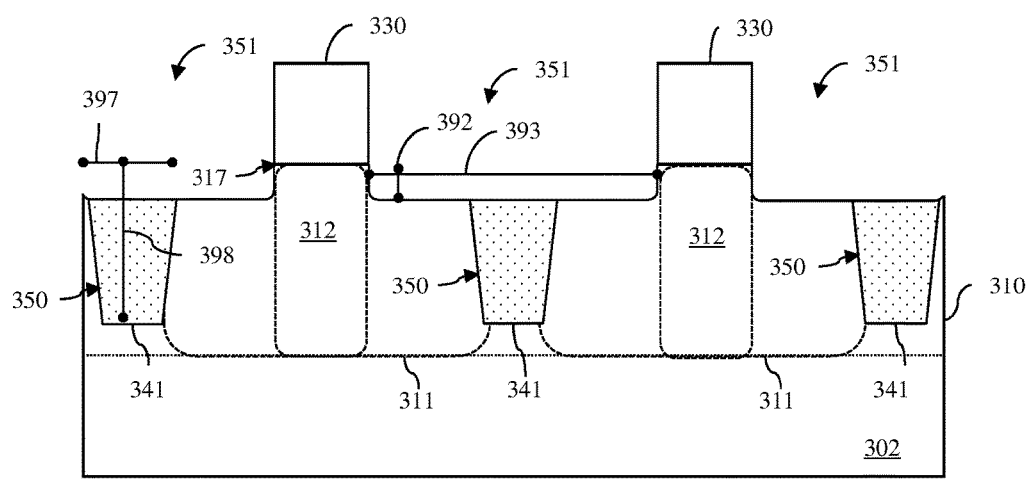
FIG. 7 is a cross-section diagram illustrating a partially completed semiconductor structure formed according to the flow diagram of FIG. 2.

Second trenches 351 can then be formed in each semiconductor fin 310 such that each second trench 351 is essentially centered on a first trench 350, is wider than that first trench 350 and is further shallower than that first trench 350 (210). Specifically, a hard mask layer (e.g., a silicon nitride hard mask layer) can be deposited over the partially completed structure. Then, lithographic patterning and etch processes can be performed in order to form, from the hard mask layer, at least one mask region 330. As illustrated in FIGS. 6A-6C, each mask region 330 can be on the top surface 317 of the semiconductor fin 310 essentially centered between a pair of first trenches 350 so as to be aligned above a designated channel region 312 for a FINFET. Each mask region 330 can further traverse the semiconductor fin 310 such that portions of the mask region 330 extend laterally onto the first isolation layer 341 on opposing sides of the semiconductor fin 310 (see FIG. 6B). After the mask region(s) 330 are formed, an anisotropic etch process can be performed to etch second trenches 351 into the exposed regions of each semiconductor fin 310 such that the second trenches 351 are essentially centered on the first trenches 350, such that the second trenches 351 have a second width 393 that is greater than the first width 397 of the first trenches 350 (as formed at process 206) and such that the second trenches 351 have a second depth 392 that is less than the first depth 398 of the first trenches 350 (see FIG. 7). As illustrated in FIG. 7, the second width 393 can be approximately equal to the distance between adjacent channel regions 312 in adjacent active device regions 311 and, since the second trenches 351 are essentially centered on the first trenches 350, the first isolation layer 341, which fills the first trenches 350, will be exposed at the bottoms of the second trenches 351.

Figure 8A:
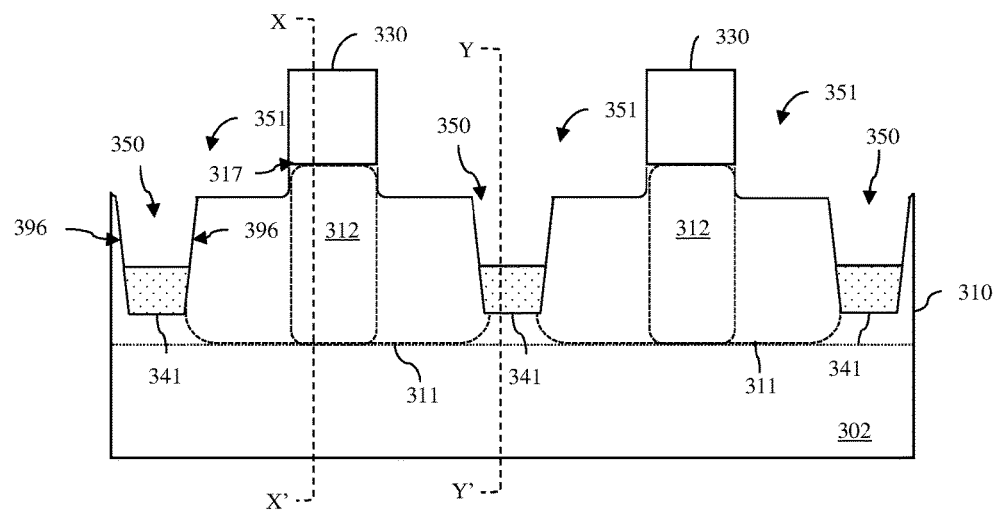
FIGS. 8A-8C are cross-section diagrams illustrating a partially completed semiconductor structure formed according to the flow diagram of FIG. 2.
Figure 8B:
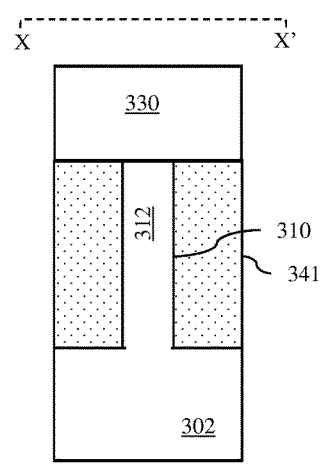
Figure 8C:
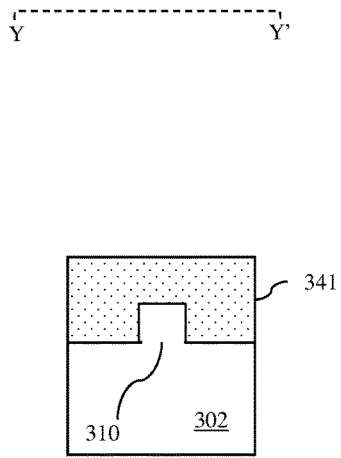

After the second trenches 351 are formed, an anisotropic selective etch process can be performed in order to etch back (i.e., recess) the first isolation layer 341 within the first trenches 350 (212, see FIGS. 8A-8C). Specifically, the first isolation layer 341 can be etched back so that the lower portions of the first trenches 350 remain filled with the first isolation layer 341 and so that, within the upper portions of the first trenches 350 above the lower portions, the opposing sidewalls 396 (and semiconductor surfaces thereof) are exposed. The first isolation layer 341 can, for example, be recessed so that the first isolation layer 341 remains only in the bottom one quarter to two thirds of each first trench 350 (and, preferably, in the bottom one quarter to one half of each first trench 350). It should be noted that, as illustrated in FIG. 8B, during this etch process, each mask region 330 will protect a portion of the first isolation layer 341 on the opposing sides of the semiconductor fin 310 at a channel region 312.

Figure 9:
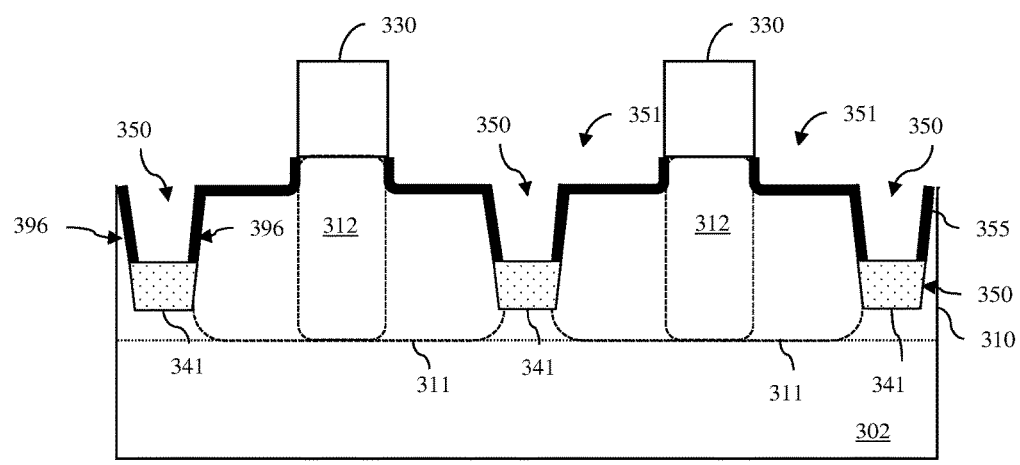
FIG. 9 is a cross-section diagram illustrating a partially completed semiconductor structure formed according to the flow diagram of FIG. 2.

Next, the exposed semiconductor surfaces in the second trenches 351 and at the opposing sidewalls 396 of the upper portions of the first trenches 350 can be lined with an undoped monocrystalline semiconductor layer 355 (214, see FIG. 9). This undoped monocrystalline semiconductor layer 355 can be formed on the exposed semiconductor surfaces by epitaxial deposition. Preferably, the semiconductor layer 355 will be made of the same first semiconductor material (e.g., silicon) as the semiconductor fin 310 so that it will have the same crystalline structure as the semiconductor fin 310. In an exemplary embodiment, the semiconductor layer 355 can be deposited so as to have a thickness ranging from approximately 1 nm to approximately 5 nm (e.g., a thickness of approximately 3 nm).

Figure 10:
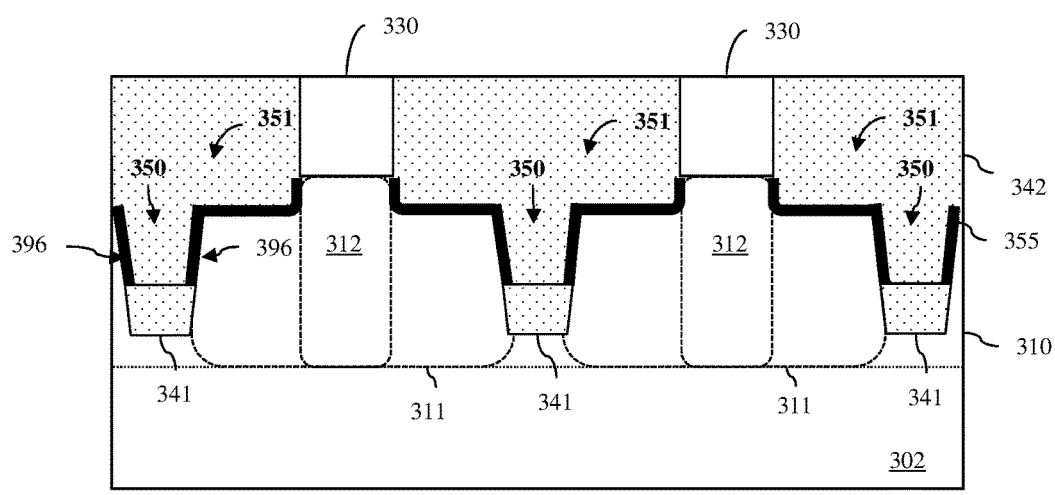
FIG. 10 is a cross-section diagram illustrating a partially completed semiconductor structure formed according to the flow diagram of FIG. 2.

Next, a second isolation layer 342 can be deposited over the partially completed structure and, particularly, onto the first isolation layer 341 so as to fill any remaining space within the first trenches 350 and the second trenches 351 (216, see FIG. 10). Thus, as illustrated, the second isolation layer 342 will be within the upper portions of the first trenches 350 above and immediately adjacent to the first isolation layer 341 and will further be positioned laterally between portions of the semiconductor layer 355 on the opposing sidewalls 396. The second isolation layer 342 can be, for example, a layer of silicon dioxide (e.g., deposited by high-density plasma (HDP) chemical vapor deposition (CVD). Alternatively, the second isolation layer 342 can be one or more layers of silicon dioxide, silicon nitride, silicon carbon nitride, silicon boron carbon nitride, silicon oxycarbide, or any other suitable isolation material. In any case, the second isolation layer 342 can be made of the same isolation material(s) as the first isolation layer 341. Alternatively, the first isolation layer 341 and the second isolation layer 342 can be made of different isolation materials.

Figure 11A:
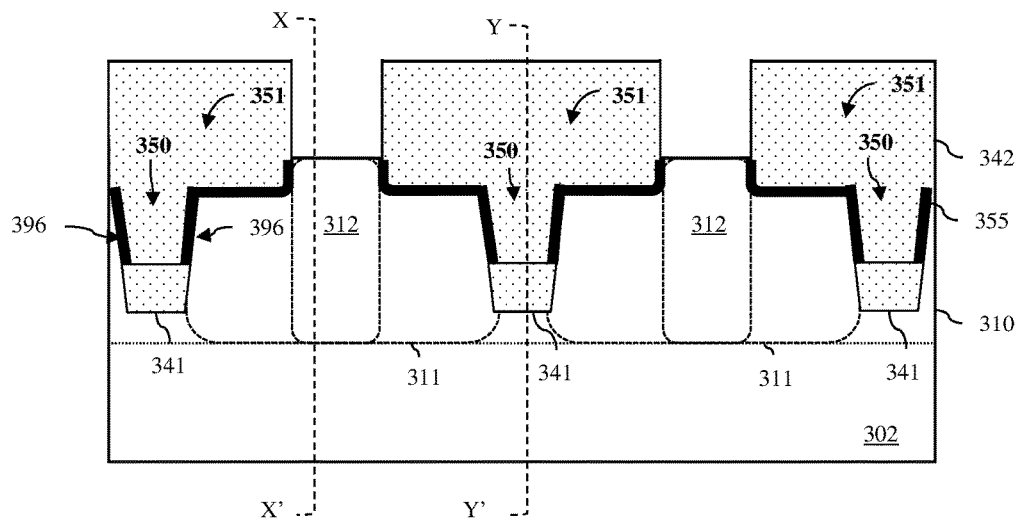
FIGS. 11A-11C are cross-section diagrams illustrating a partially completed semiconductor structure formed according to the flow diagram of FIG. 2.
Figures 11B, 11C:
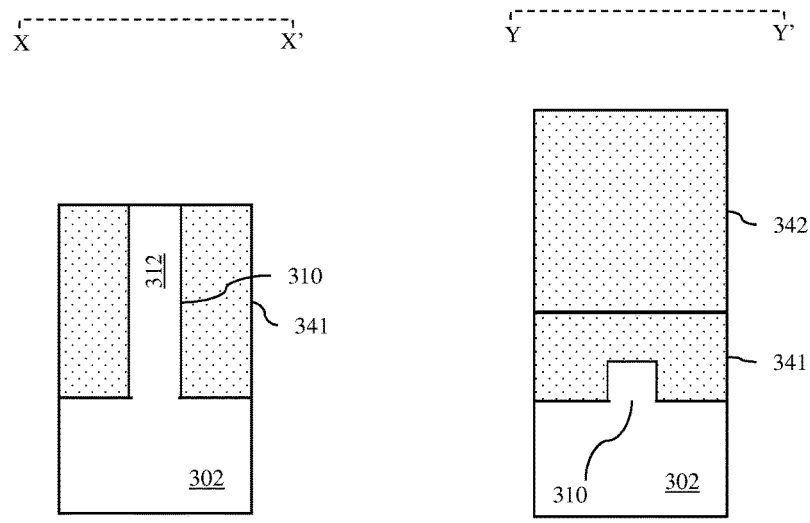

After the second isolation layer 342 is deposited, a polishing process (e.g., a CMP process) can be performed to expose the mask region(s) 330 (see FIG. 10) and the mask regions can be selectively removed (see FIGS. 11A-11C). Next, an anisotropic selective etch process is performed in order to etch back (i.e., recess) exposed horizontal surfaces of both the second isolation layer 342 and the isolation material adjacent to the sidewalls of the semiconductor fin 310 (see FIGS. 12A-12C). Specifically, the second isolation layer 342 can be etched back so that the top surface of the second isolation layer 342 is approximately level with the top surface 317 of the semiconductor fin 310. Additionally, the isolation material that laterally surrounds the semiconductor fin 310 can be etched back to expose the opposing sidewalls of the semiconductor fin 310 at each channel region 312. As mentioned above, the isolation material that laterally surrounds the semiconductor fin 310 can be either the first isolation layer 341 (e.g., when that first isolation layer 341 is used to fill both the first trenches 350 and the space adjacent to the semiconductor fin 310 at process 208) or another layer of isolation material, which is the same as the first isolation layer 341 and which is deposited prior to first trench formation. In any case, this etch process not only completes formation of trench isolation regions 305 and, particularly, single-diffusion break (SDB) type isolation regions, but also exposes the opposing sides of the semiconductor fin 310 at each channel region 312 so that gate structures can subsequently be formed thereon. It should be noted that, as illustrated, each trench isolation region 305 (i.e., each SDB-type isolation region) includes: a first trench 350; a first isolation layer 341 that fills the lower portion of that first trench 350; a semiconductor layer 355 that lines the opposing sidewalls 396 of the upper portion of that first trench 350; and a second isolation layer 342 that is above and immediately adjacent to the first isolation layer 341 and fills the remaining space in the upper portion of that first trench 350. Additionally, as illustrated, an active device region 311 for a FINFET is positioned laterally between each pair of adjacent trench isolation regions 305.

After the trench isolation regions 305 are formed, each active device region 311 can be used to form a corresponding FINFET (217).

Figure 13:
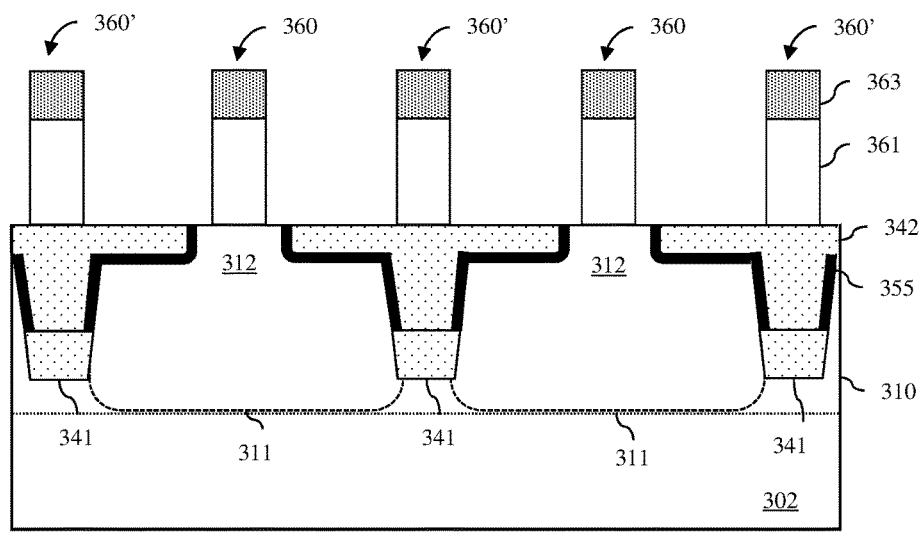
FIG. 13 is a cross-section diagram illustrating a partially completed semiconductor structure formed according to the flow diagram of FIG. 2.

To form the FINFET(s), gate structures can be formed on the partially completed structure (218, see FIG. 13). The gate structures formed at process 218 can include first gate structure(s) 360 and second gate structures 360'. Each first gate structure 360 can be on the top surface 317 and opposing sidewalls of the semiconductor fin 310 at a channel region 312 (i.e., essentially centered between a pair of adjacent trench isolation regions 305). Each second gate structure 360' can be on the top surface of a trench isolation region 305.

The gate structures 360/360' formed at process 218 can be sacrificial gate structures, which are to be used as placeholders for subsequent replacement metal gate (RMG) processing (discussed in detail below). To form sacrificial gate structures, a sacrificial gate stack can be formed on the partially completed structure. The sacrificial gate stack can include, for example: a thin sacrificial oxide layer; a sacrificial polysilicon layer, a sacrificial amorphous silicon layer or a sacrificial layer of some other suitable sacrificial material on the sacrificial oxide layer; and a sacrificial gate cap layer, such as a sacrificial silicon nitride gate cap layer. Lithographic patterning and etch processes can then be performed in order to form, from this sacrificial gate stack, sacrificial gates 361, each having a sacrificial gate cap 363 (see FIG. 13).

Alternatively, the gate structures 360/360' formed at process 218 can be conventional gate-first gate structures. To form gate-first gate structures, a gate stack can be formed on the partially completed structure. The gate stack can include, for example: a gate dielectric layer, such as a silicon dioxide gate dielectric layer; a gate conductor layer, such as a polysilicon gate conductor layer, on the gate dielectric layer; and a gate cap layer, such as a silicon nitride gate cap layer, on the gate conductor layer. Lithographic patterning and etch processes can then be performed in order to form, from this gate stack, gate-first gates, each having a gate cap.

Figure 14:
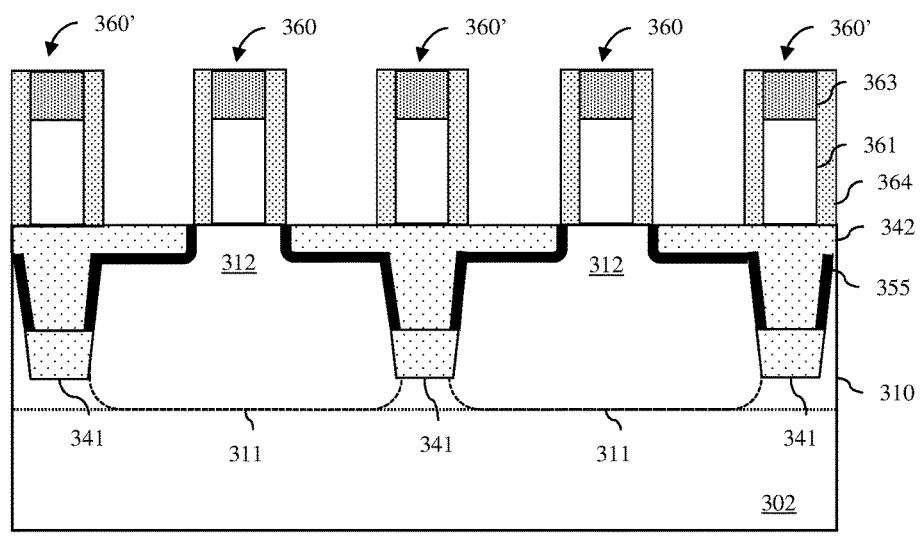
FIG. 14 is a cross-section diagram illustrating a partially completed semiconductor structure formed according to the flow diagram of FIG. 2.

In any case, gate sidewall spacers 364 can be formed on the sidewalls of the gate structures 360/360' (220, see FIG. 14). To form the gate sidewall spacers 364, a relatively thin conformal spacer layer (e.g., a silicon nitride layer or other suitable dielectric spacer layer) can be deposited over the partially completed structure. An anisotropic etch process can then be performed so as to remove the conformal spacer layer from horizontal surfaces, thereby forming the gate sidewall spacers 364 on the essentially vertical surfaces of the gate structures 360/360'.

Figure 15:
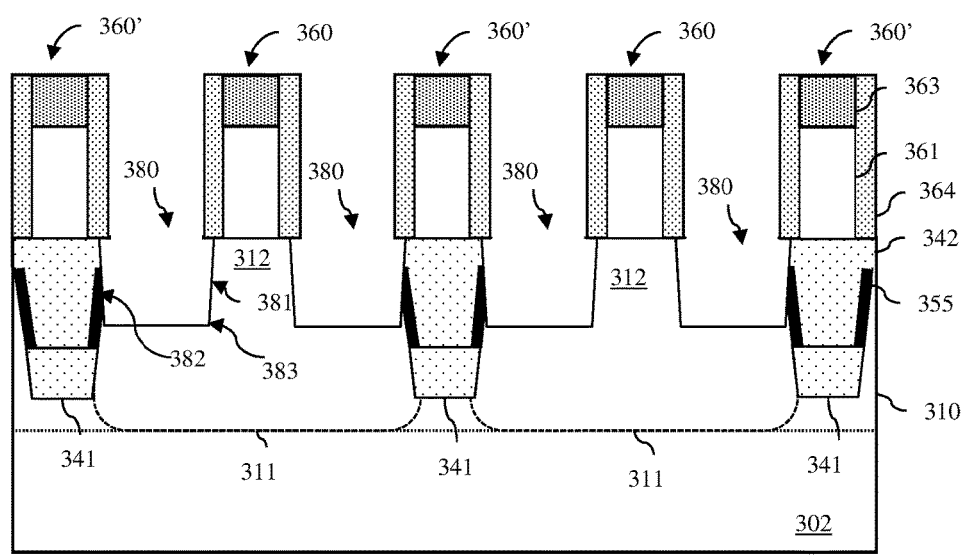
FIG. 15 is a cross-section diagram illustrating a partially completed semiconductor structure formed according to the flow diagram of FIG. 2.

Following gate sidewall spacer formation, source/drain recesses 380 can be formed (222, see FIG. 15). Specifically, one or more anisotropic etch processes can be performed to etch source/drain recesses 380 into each semiconductor fin 310 on opposing sides of the gate structures 360/360'. These source/drain recesses 380 will specifically be etched through portions of the second isolation layer 342 and semiconductor layer 355 within sections of the second trenches 351 between adjacent gate structures and further into each active device region 311 below. Thus, each source/drain recess 380 will have a first side 381 adjacent to a channel region 312, a second side 382 opposite the first side 381 adjacent to a trench isolation region 305 and a bottom 383.

Figure 16:
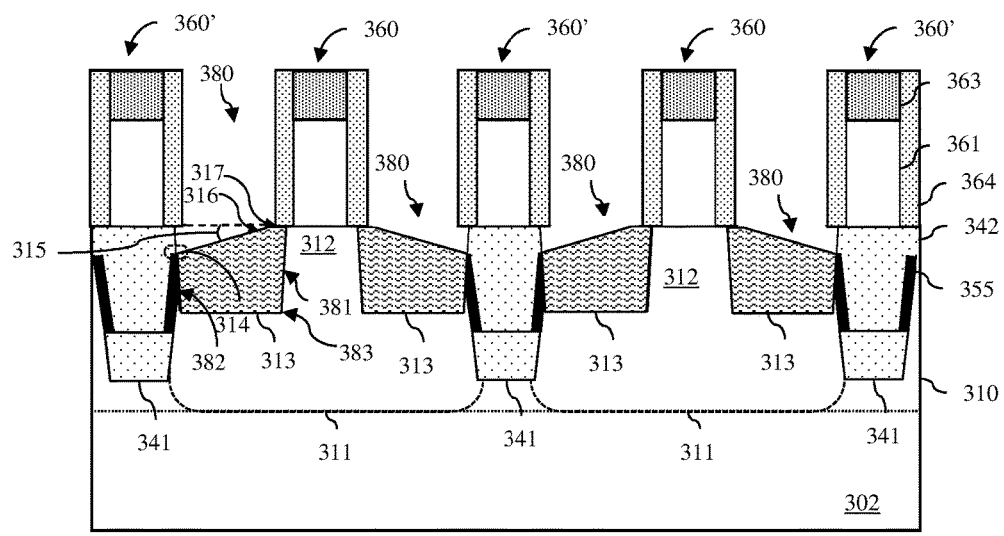
FIG. 16 is a cross-section diagram illustrating a partially completed semiconductor structure formed according to the flow diagram of FIG. 2.

Source/drain regions 313 can then be formed within the source/drain recesses 380 (224, see FIG. 16). The source/drain regions 313 can be formed, for example, by epitaxially depositing an additional semiconductor layer in the source/drain recesses 380. The additional semiconductor layer can be in-situ doped so as to have the appropriate type conductivity at a relatively high conductivity level. For example, for a P-type FINFET, the additional semiconductor layer can be in-situ doped with a P-type dopant so as to have P+ conductivity; whereas, for an N-type FINFET, the additional semiconductor layer can be in-situ doped with an N-type dopant so as to have N+ conductivity. The additional semiconductor layer can be made of the same first semiconductor material as that used for the semiconductor fin 310 and the semiconductor layer 355 (e.g., silicon). Alternatively, the additional semiconductor layer can be made of a second semiconductor material that is different from the first semiconductor material. The type of second semiconductor material used may be preselected to enhance FINFET performance and may vary depending upon whether the FINFET being formed is a P-type FINFET or an N-type FINFET. For example, for a P-type FINFET, the additional semiconductor layer can be a silicon germanium (SiGe) layer, which will enhance majority charge carrier mobility within the P-type FINFET's channel region and, thereby enhance performance. For an N-type FINFET, the additional semiconductor layer can be a silicon carbide (SiC) layer, which will enhance majority charge carrier mobility within the N-type FINFET's channel region and, thereby enhance performance.

It should be noted that in the method embodiments described above the semiconductor layer 355 within the trench isolation regions 305 (i.e., the semiconductor liner) ensures that, if/when a source/drain recess 380 is formed so that it abuts an adjacent trench isolation region 305, semiconductor surfaces will be exposed, not only at the first side 381 of the source/drain recess 380 adjacent to the channel region 312 and at the bottom 383 of the source/drain recess 380, but also at the second side 382 of the source/drain recess 380 opposite the first side 381 (i.e., at the trench isolation region 305). Thus, when the additional semiconductor layer is epitaxially deposited into that source/drain recess 380 to form a source/drain region 313, the additional semiconductor layer will grow, not only on the first side 381 and bottom 383 of the source/drain recess 380, but also on the second side 382 of the source/drain recess 380.

As a result, as shown in FIG. 16, the angle 315 of the top surface 316 of the source/drain region 313 relative to the top surface 317 of the semiconductor fin 310 will be minimized. More specifically, since the additional semiconductor layer is epitaxially grown on the semiconductor layer 355, the resulting source/drain region 313 will have a facet corner 314 that is not located deep within the recess (e.g., adjacent the bottom of the recess), but rather located adjacent to a top end of the semiconductor layer 355. Thus, the top surface 316 of the source/drain region 313 will have a first end adjacent to the channel region 312 at the top surface 317 of the semiconductor fin 310 and a second end adjacent to the trench isolation region 305 at the top of the semiconductor layer 355.

Following formation of the source/drain regions 313, additional processing can be performed in order to complete the semiconductor structure 300 with one or more FINFETs (226-232).

Figure 17:
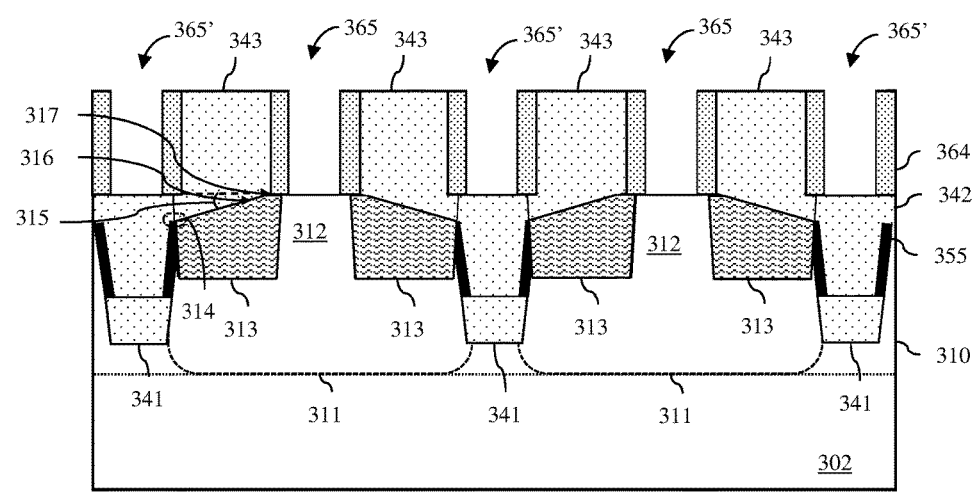
FIG. 17 is a cross-section diagram illustrating a partially completed semiconductor structure formed according to the flow diagram of FIG. 2.
Figure 18:
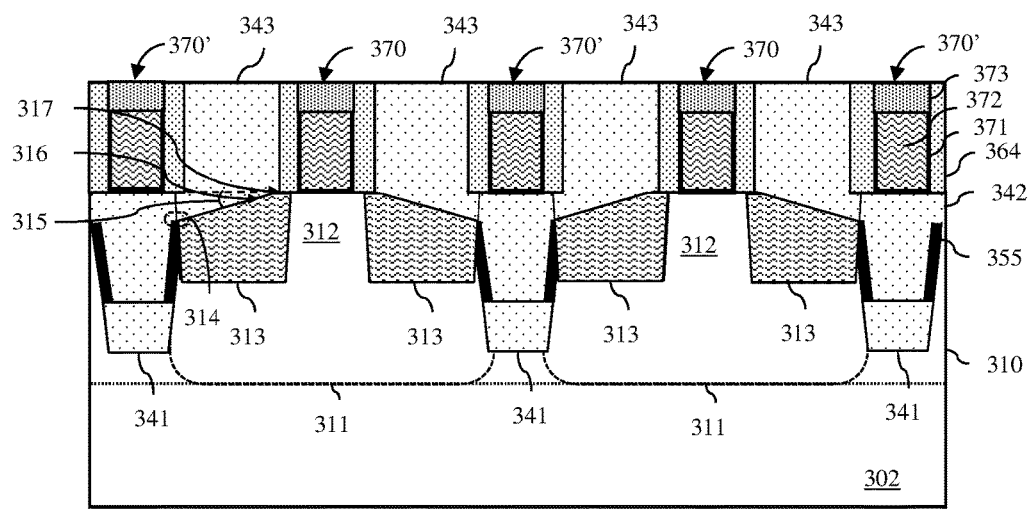
FIG. 18 is a cross-section diagram illustrating a partially completed semiconductor structure formed according to the flow diagram of FIG. 2.

For example, a blanket interlayer dielectric (ILD) layer 343 can be deposited over the partially completed structures (226, see FIG. 17). The ILD layer 343 can be, for example, a silicon oxide layer or one or more layers of any suitable ILD material(s) (e.g., silicon dioxide, silicon nitride, borophosphosilicate glass (BPSG), tetraethyl orthosilicate (TEOS), fluorinated tetraethyl orthosilicate (FTEOS), etc.). Additionally, if the gate structures 360/360' formed at process 218 were sacrificial gate structures as opposed to gate-first gate structures, a polishing process (e.g., a CMP process) can be performed to expose the tops of the sacrificial gates 361 (i.e., to remove the sacrificial gate caps 363) from each of the gate structures 360/360'. Then, the sacrificial gates 361 can be selectively removed (see FIG. 17) and replaced with replacement metal gates (RMGs) (228, see FIG. 18).

Specifically, the sacrificial material of the sacrificial gates 361 can be selectively etched over the semiconductor material of the semiconductor fin 310 as well as over the adjacent dielectric materials of the gate sidewall spacer 364 and the ILD layer 343, thereby creating gate openings 365/365' in the ILD layer 343. It should be noted that, since each gate structure 360 was formed adjacent to the top surface and opposing sides of the semiconductor fin 310 at a channel region, the corresponding gate openings 365 will expose the top surface and opposing sides of the semiconductor fin 310 at a channel region 312. In any case, each gate opening 365/365' will have sidewalls lined with a gate sidewall spacer 364. Replacement metal gates (RMGs) can be formed including functional RMG(s) 370 for the FINFET(s) 301 in the gate opening(s) 365 adjacent to the top surface and opposing sides the semiconductor fin 310 at the channel region(s) 312 and non-functional RMGs 370' above the trench isolation regions 305 (see FIG. 18).

Exemplary techniques for forming RMGs include conformally depositing a gate dielectric layer 371 so as to line the gate openings 365/365' and, then, depositing a stack of gate conductor layers 372 on the gate dielectric layer 371 in order to fill the gate openings. The stack of gate conductor layers 372 can include, for example, at least one conformal work function metal layer and a conductive fill material layer on the conformal work function metal layer(s).

It should be noted that the conformal gate dielectric layer 371 could be a silicon dioxide gate dielectric layer. Alternatively and preferably, the conformal gate dielectric layer can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The conformal work function metal can include a metal material or metal alloy material that is preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material layer can be a blanket layer of a metal or a metal alloy, such as tungsten, a tungsten alloy (e.g., tungsten silicide or titanium tungsten), cobalt, aluminum or any other suitable metal or metal alloy.

In any case, after the RMG materials are deposited so as to fill the gate openings 365/365', a polishing process (e.g., a CMP process) can be performed in order to remove the RMG materials from above the top surface of the ILD layer 343. Then, the RMG materials within the gate openings can be etched back (i.e., recessed). After the RMG materials are etched back, a dielectric cap layer (e.g., a silicon nitride cap layer) can be deposited and polished (e.g., by CMP) in order to form dielectric caps 373 for the RMGs 370/370'.

It should be understood that the techniques described above for forming the RMGs are offered for illustration purposes only and are not intended to be limiting. Alternatively, any other suitable technique for forming RMG could be used.

Figure 19:
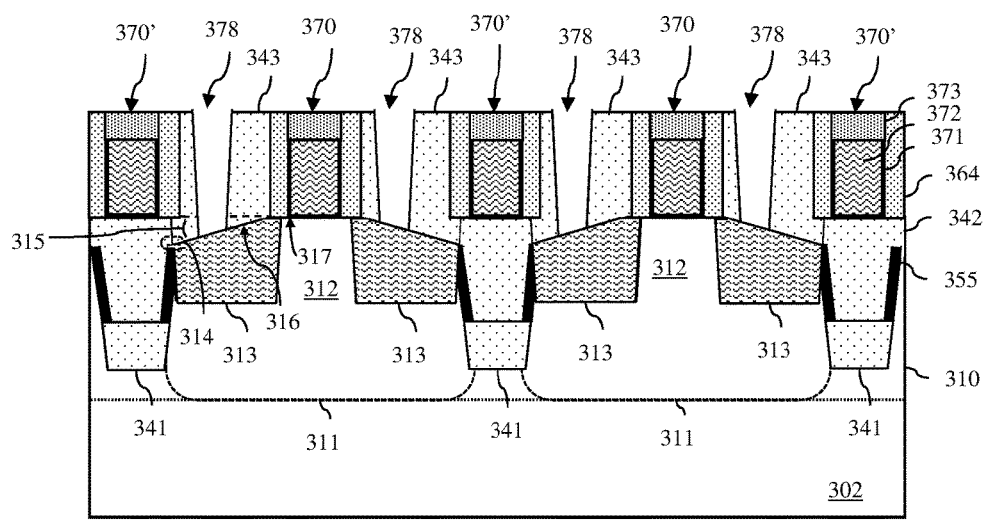
FIG. 19 is a cross-section diagram illustrating a partially completed semiconductor structure formed according to the flow diagram of FIG. 2.

Next, lithographic patterning and etch processes can be performed in order to form contact openings 378 that extend essentially vertically through the ILD layer 343 to the top surfaces 316 of the source/drain regions 313 (230, see FIG. 19). Then, source/drain contacts 318 (also referred to in the art as metal plugs) can be formed in the contact openings 378 (232, see FIGS. 20A-20C). These contacts 318 can be formed, for example, by optionally depositing one or more conformal layers such as a conformal adhesive layer (e.g., a titanium adhesive layer or other suitable adhesive layer) and/or a conformal barrier layer (e.g., titanium nitride barrier layer or other suitable barrier layer) to line the contact openings and, then, depositing a conductor and, particularly, a metal or metal alloy (e.g., a tungsten, cobalt, aluminum or any other suitable metal plug material) to fill the remaining spaces within the contact openings.

Since the angle 315 of the top surface 316 of each source/drain region 313 relative to the top surface 317 of the semiconductor fin 310 is minimized (e.g., due to the presence of the semiconductor layer within the trench isolation region 305), the risk that a contact opening 378 will not reach a source/drain region at process 230 is minimized. Thus, the risk of unlanded contacts is minimized. That is, the risk that a defect and, particularly, a void will be present between any given source/drain contact 318 formed at process 232 and the source/drain region 313 below is minimized.

Figure 20A:
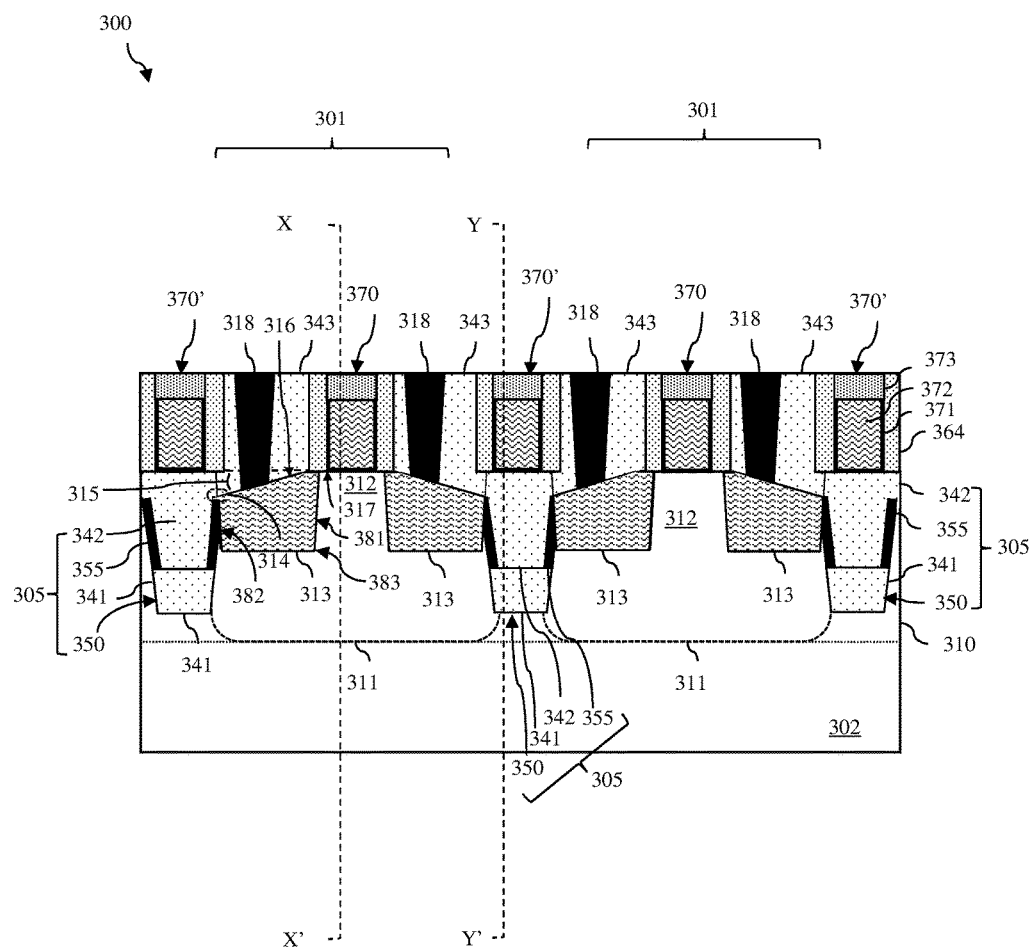
FIGS. 20A-20C are cross-section diagrams illustrating a semiconductor structure formed according to the flow diagram of FIG. 2.
Figure 20B:
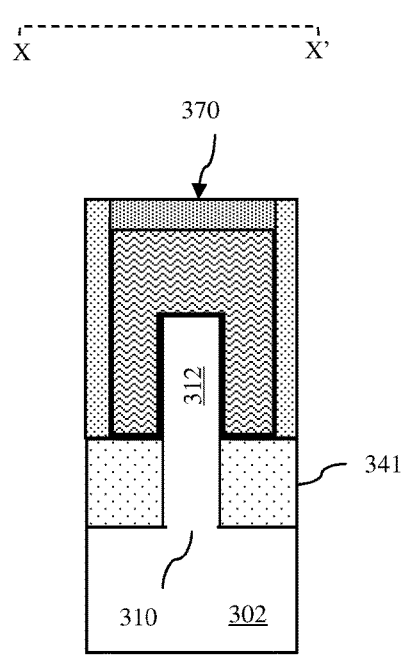
Figure 20C:
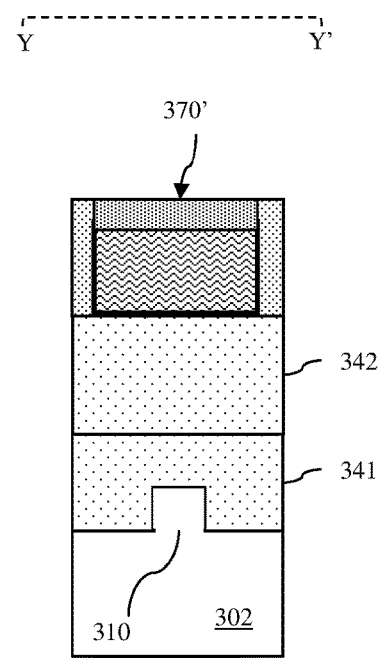

Referring to FIGS. 20A-20C, also disclosed herein are embodiments of a semiconductor structure 300 that includes one or more fin-type field effect transistors (FINFETs) 301 and single-diffusion break (SDB) type isolation regions, which are in a semiconductor fin 310 and which define the active device region(s) 311 for the FINFET(s) 301.

The semiconductor structure 300 can include a semiconductor fin 310 on a semiconductor substrate. For example, the semiconductor fin 310 can be formed from an upper portion of a bulk semiconductor wafer 302, as illustrated. Alternatively, the semiconductor fin 310 can be formed from a semiconductor layer of a semiconductor-on-insulator wafer (e.g., a silicon-on-insulator (SOI) wafer or any other suitable semiconductor-on-insulator wafer). In any case, the semiconductor fin can be made of a first semiconductor material (e.g., silicon or some other suitable monocrystalline semiconductor material). For purposes of this disclosure a semiconductor fin refers to a relatively tall and thin, elongated, semiconductor body that is essentially rectangular in shape.

The semiconductor structure 300 can further include trench isolation regions 305 and, particularly, SDB-type isolation regions located within the semiconductor fin 310. The trench isolation regions 305 can define active device region(s) 311 within the semiconductor fin 310. That is, within the semiconductor fin 310, an active device region 311 can be positioned laterally between each pair of trench isolation regions 305.

Each trench isolation region 305 (i.e., each SDB-type isolation region) can include a trench 350 that extends essentially vertically into the semiconductor fin 310 and further cuts across the full width of the semiconductor fin 310. Each trench 350 can have a lower portion and an upper portion above the lower portion.

With each trench 350, a first isolation layer 341 can fill the lower portion. For example, the first isolation layer 341 can fill the bottom one quarter to two thirds (and, preferably, the bottom on quarter to one half) of the trench 350. The first isolation layer 341 can be, for example, a layer of silicon dioxide. Alternatively, the first isolation layer 341 can be one or more layers of silicon dioxide, silicon nitride, silicon carbon nitride, silicon boron carbon nitride, silicon oxycarbide, or any other suitable isolation material.

Within each trench 350, a semiconductor layer 355 (e.g., an epitaxial semiconductor layer) can line opposing sidewalls 396 in the upper portion. The semiconductor layer 355 can be an undoped monocrystalline semiconductor layer 355. Preferably, the semiconductor layer 355 will be made of the same first semiconductor material (e.g., silicon) as the semiconductor fin 310 so that it will have the same crystalline structure as the semiconductor fin 310. In an exemplary embodiment, the semiconductor layer 355 can have a thickness ranging from approximately 1 nm to approximately 5 nm (e.g., a thickness of approximately 3 nm).

Additionally, within each trench 350, a second isolation layer 342 can fill any remaining space in the upper portion. That is, the second isolation layer 342 can be above and immediately adjacent to a top surface of the first isolation layer 341 and can be positioned laterally immediately adjacent to and between portions of the semiconductor layer 355. The second isolation layer 342 can be, for example, a layer of silicon dioxide. Alternatively, the second isolation layer 342 can be one or more layers of silicon dioxide, silicon nitride, silicon carbon nitride, silicon boron carbon nitride, silicon oxycarbide, or any other suitable isolation material. In any case, the second isolation layer 342 can be made of the same isolation material(s) as the first isolation layer 341. Alternatively, the first isolation layer 341 and the second isolation layer 342 can be made of different isolation materials.

The semiconductor structure 300 can further include at least one transistor 301 and, particularly, at least one FINFET. Each FINFET 301 can include source/drain regions 313; a channel region 312 positioned laterally between the source/drain regions 313; and a gate structure 370 adjacent to the top surface and opposing sidewalls of the semiconductor fin 310 at the channel region 312.

Specifically, the channel region 312 can be within a corresponding active device region 311 in the semiconductor fin 310. The active device region 311 or at least the channel region 312 therein can have appropriate type conductivity at a relatively low conductivity level. For example, for a P-type FINFET, the channel region 312 can be doped so as to have an N-conductivity; whereas, for an N-type FINFET, the channel region 312 can be doped so as to have a P–conductivity. Alternatively, the channel region 312 can be undoped.

The gate structure 370 can be a replacement metal gate (RMG) structure. Alternatively, the gate structure 370 can be a gate-first gate structure. In any case the gate structure 370 can have a gate sidewall spacer 364. It should be noted that, given the method used to form the semiconductor structure 300, as described in detail above, the semiconductor structure will also include non-functioning RMGs 370' above each of the trench isolation regions 305.

The source/drain regions 313 can be on opposite sides of the gate structure 370. Each source/drain region 313 can include a source/drain recess having a first side 381, a second side 382 opposite the first side 381 and a bottom 383. The first side 381 can be positioned laterally adjacent to the channel region 312. The second side 382 can be positioned laterally adjacent to a trench isolation region 305. The bottom 383 can be at a predetermined depth, which is some distance above the bottom of the semiconductor fin 310. Optionally, the second side 382 of the source/drain recess can actually abut the adjacent trench isolation region 305, as illustrated. Each source/drain region 313 can further include an additional semiconductor layer within the source/drain recess.

The additional semiconductor layer can be an epitaxial semiconductor layer that is in-situ doped so as to have the appropriate type conductivity at a relatively high conductivity level. For example, for a P-type FINFET, the additional semiconductor layer can be in-situ doped with a P-type dopant so as to have P+ conductivity; whereas, for an N-type FINFET, the additional semiconductor layer can be in-situ doped with an N-type dopant so as to have N+ conductivity.

The additional semiconductor layer can be made of the same first semiconductor material as that used for the semiconductor fin 310 and the semiconductor layer 355 (e.g., silicon). Alternatively, the additional semiconductor layer can be made of a second semiconductor material that is different from the first semiconductor material. The type of second semiconductor material used may be preselected to enhance FINFET performance and may vary depending upon whether the FINFET being formed is a P-type FINFET or an N-type FINFET. For example, for a P-type FINFET, the additional semiconductor layer can be a silicon germanium (SiGe) layer, which will enhance majority charge carrier mobility within the P-type FINFET's channel region and, thereby enhance performance. For an N-type FINFET, the additional semiconductor layer can be a silicon carbide (SiC) layer, which will enhance majority charge carrier mobility within the N-type FINFET's channel region and, thereby enhance performance.

As mentioned above, the second side 382 of the source/drain recess can abut the adjacent trench isolation region 305 and, in this case, the semiconductor layer 355 within the trench isolation region 305 ensures that, when the additional semiconductor layer is epitaxially deposited into that source/drain recess, the additional semiconductor layer will grow, not only on the first side 381 and bottom 383 of the source/drain recess 380, but also on the second side 382 of the source/drain recess 380. As a result, as shown in FIG. 20A, the angle 315 of the top surface 316 of the source/drain region 313 relative to the top surface 317 of the semiconductor fin 310 will be minimized. More specifically, since the additional semiconductor layer is epitaxially grown on the semiconductor layer 355, the resulting source/drain region 313 will have a facet corner 314 that is not located deep within the recess (e.g., adjacent the bottom of the recess), but rather located adjacent to a top end of the semiconductor layer 355. Thus, the top surface 316 of the source/drain region 313 will have a first end adjacent to the channel region 312 at the top surface 317 of the semiconductor fin 310 and a second end adjacent to the trench isolation region 305 at the top of the semiconductor layer 355.

The semiconductor structure 300 can further include a blanket interlayer dielectric (ILD) layer 343 on the top surface 316 of each of the source/drain regions 313 and laterally surrounding the gate structures 370/370'. The ILD layer 343 can be, for example, a silicon oxide layer or one or more layers of any suitable ILD material(s) (e.g., silicon dioxide, silicon nitride, borophosphosilicate glass (BPS G), tetraethyl orthosilicate (TEOS), fluorinated tetraethyl orthosilicate (FTEOS), etc.).

The semiconductor structure 300 can further includes source/drain contacts 318 (also referred to in the art as metal plugs). Specifically, the semiconductor structure 300 can include contact openings that extend essentially vertically through the ILD layer 343 to the top surfaces 316 of the source/drain regions 313. Contacts 318 within the contact openings can include one or more conformal layers such as a conformal adhesive layer (e.g., a titanium adhesive layer or other suitable adhesive layer) and/or a conformal barrier layer (e.g., titanium nitride barrier layer or other suitable barrier layer), which line the contact openings. The contacts 318 can further include a conductor and, particularly, a metal or metal alloy (e.g., a tungsten, cobalt, aluminum or any other suitable metal plug material), which fills the remaining space within the contact openings. Since, as discussed above, the angle 315 of the top surface 316 of each source/drain region 313 relative to the top surface 317 of the semiconductor fin 310 is minimized (e.g., due to the presence of the semiconductor layer within the trench isolation region 305), the risk of the risk of any unlanded contacts is minimized. That is, the risk that a defect and, particularly, a void will be present between any given source/drain contact 318 and the source/drain region 313 below is minimized.

In the embodiments of the method and semiconductor structure described above, the FINFET(s) 301 can be N-type FINFET(s) or P-type FINFET(s). As discussed above, for an N-type FINFET, the channel region can have P-type conductivity (or can be undoped) and the source/drain regions can have N-type conductivity; whereas, for a P-type FINFET, the channel region can have N-type conductivity (or can be undoped) and the source/drain regions can have P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

It should be understood that the terminology used herein is for the purpose of describing the disclosed method and structure and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    a semiconductor fin comprising an active device region;
    isolation regions in the semiconductor fin, the active device region being positioned laterally between the isolation regions, each isolation region comprising:
        a trench having a lower portion and an upper portion above the lower portion, the upper portion having opposing sidewalls;
        a first isolation layer filling the lower portion;
        a semiconductor layer having discrete semiconductor layer sections lining the opposing sidewalls of the upper portion and having bottoms immediately adjacent to a top surface of the first isolation layer and tops opposite the bottoms; and
        a second isolation layer in the upper portion above and immediately adjacent to the top surface of the first isolation layer, wherein the second isolation layer is further positioned laterally between and immediately adjacent to the semiconductor layer sections and wherein the second isolation layer is taller than the semiconductor layer sections such that a top surface of the second isolation layer is above a level of the tops of the semiconductor layer sections; and
    a transistor comprising source/drain regions in the active device region adjacent to the isolation regions.

2. The semiconductor structure of claim 1, the source/drain regions comprising:
    source/drain recesses in the active device region adjacent to the isolation regions; and
    an additional semiconductor layer in the source/drain recesses, wherein at least one source/drain recess abuts an adjacent isolation region such that the additional semiconductor layer is positioned laterally immediately adjacent to a semiconductor layer section lining a sidewall of the adjacent isolation region.

3. The semiconductor structure of claim 2, wherein the semiconductor fin and the semiconductor layer comprise a first semiconductor material and the additional semiconductor layer comprises a second semiconductor material that is different from the first semiconductor material.

4. The semiconductor structure of claim 2, wherein the semiconductor fin and the semiconductor layer comprise silicon and the additional semiconductor layer comprises silicon germanium.

5. The semiconductor structure of claim 1,
wherein the semiconductor fin has a first top surface,
wherein the source/drain regions have second top surfaces,
wherein a second top surface of at least one source/drain region has a first end and a second end, the first end being adjacent the channel region at the first top surface of the semiconductor fin and the second end being adjacent to a top of a semiconductor layer section lining a sidewall of an adjacent isolation region such that the second top surface of the at least one source/drain region is angled, and
wherein the semiconductor structure further comprises contacts to the second top surfaces of the source/drain regions.

6. The semiconductor structure of claim 1, the semiconductor layer having a thickness of 1-5 nm.

7. The semiconductor structure of claim 1, wherein the first isolation layer and the second isolation layer comprise different isolation materials.

8. The semiconductor structure of claim 1,
wherein the transistor further comprises: a channel region within the semiconductor fin and positioned laterally between the source/drain regions; and a first gate structure adjacent to the semiconductor fin at the channel region, and
wherein the semiconductor structure further comprises a second gate structure on each isolation region immediately adjacent to the top surface of the second isolation layer such that the second gate structure is physically separated from the semiconductor layer sections.

9. The semiconductor structure of claim 1, wherein the source/drain regions are above a level of the bottoms of the semiconductor layer sections.

10. A semiconductor structure comprising:
a semiconductor fin;
isolation regions in the semiconductor fin, each isolation region comprising:
    a trench having a lower portion and an upper portion above the lower portion, the upper portion having opposing sidewalls;
    a first isolation layer filling the lower portion;
    a semiconductor layer having discrete semiconductor layer sections lining the opposing sidewalls of the upper portion, wherein the semiconductor layer sections have bottoms immediately adjacent to a top surface of the first isolation layer and tops opposite the bottoms; and
    a second isolation layer in the upper portion above and immediately adjacent to the top surface of the first isolation layer, wherein the second isolation layer is further positioned laterally between and immediately adjacent to the semiconductor layer sections and wherein the second isolation layer is taller than the semiconductor layer sections such that a top surface of the second isolation layer is above a level of the tops of the semiconductor layer sections;
a transistor comprising, in the semiconductor fin between two of the isolation regions: source/drain regions; and a channel region positioned laterally between the source/drain regions
    wherein each source/drain region comprises: a source/drain recess with a first side adjacent to the channel region and a second side opposite the first side; and an additional semiconductor layer in the source/drain recess, and
    wherein the additional semiconductor layer of at least one source/drain region has an angled top surface that angles downward from a first end at the first side to a second end at the second side; and
an interlayer dielectric layer on the source/drain regions, wherein a portion of the interlayer dielectric layer on the angled top surface is positioned laterally immediately adjacent to the second isolation layer of an adjacent isolation region.

11. The semiconductor structure of claim 10, wherein the additional semiconductor layer comprises an epitaxial semiconductor layer.

12. The semiconductor structure of claim 10, wherein the semiconductor fin and the semiconductor layer comprise a first semiconductor material and the additional semiconductor layer comprises a second semiconductor material that is different from the first semiconductor material.

13. The semiconductor structure of claim 10, wherein the semiconductor fin and the semiconductor layer comprise silicon and the additional semiconductor layer comprises silicon germanium.

14. The semiconductor structure of claim 10, further comprising contacts that extend through the interlayer dielectric layer to the source/drain regions.

15. The semiconductor structure of claim 10, the semiconductor layer having a thickness of 1-5 nm.

16. The semiconductor structure of claim 10, wherein the first isolation layer and the second isolation layer comprise different isolation materials.

17. The semiconductor structure of claim 10,
wherein the transistor further comprises a first gate structure adjacent to the semiconductor fin at the channel region, and
wherein the semiconductor structure further comprises a second gate structure on each isolation region immediately adjacent to the top surface of the second isolation layer such that the second gate structure is physically separated from the semiconductor layer sections.

18. The semiconductor structure of claim 10, wherein the source/drain regions are above a level of the bottoms of the semiconductor layer sections.

19. A semiconductor structure comprising:
a semiconductor fin;
isolation regions in the semiconductor fin, each isolation region comprising:
    a trench having a lower portion and an upper portion above the lower portion, the upper portion having opposing sidewalls;
    a first isolation layer filling the lower portion;
    an epitaxial semiconductor layer having discrete semiconductor layer sections lining the opposing sidewalls of the upper portion, wherein the semiconductor layer sections have bottoms immediately adjacent to a top surface of the first isolation layer and tops opposite the bottoms; and a second isolation layer in the upper portion above and immediately adjacent to the top surface of the first isolation layer, wherein the second isolation layer is further positioned laterally between and immediately adjacent to the semiconductor layer sections, and wherein the second isolation layer is taller than the semiconductor layer sections such that a top surface of the second isolation layer is above a level of the tops of the semiconductor layer sections;

a transistor comprising, in the semiconductor fin between two of the isolation regions: source/drain regions; and a channel region positioned laterally between the source/drain regions
   wherein each source/drain region comprises:
      a source/drain recess with a first side adjacent to the channel region, a second side opposite the first side and a bottom surface above a level of the bottoms of the semiconductor layer sections; and
      an additional epitaxial semiconductor layer in the source/drain recess, wherein the additional epitaxial semiconductor layer of at least one source/drain region has an angled top surface that angles downward from a first end at the first side to a second end at the second side; and an interlayer dielectric layer on the source/drain regions, wherein a portion of the interlayer dielectric layer on the angled top surface is positioned laterally immediately adjacent to the second isolation layer of an adjacent isolation region.

20. The semiconductor structure of claim 19, wherein the epitaxial semiconductor layer has a thickness of 1-5 nm.

* * * * *